United States Patent
Chalken et al.

(10) Patent No.: US 6,900,468 B2
(45) Date of Patent: May 31, 2005

(54) INDIUM CHALCOGENIDE, GALLIUM CHALCOGENIDE, AND INDIUM-GALLIUM CHALCOGENIDE PHASE-CHANGE MEDIA FOR ULTRA-HIGH-DENSITY DATA-STORAGE DEVICES

(75) Inventors: Alison Chalken, Fremont, CA (US); Gary Gibson, Palo Alto, CA (US); Heon Lee, Sunnyvale, CA (US); Krysztof Nauka, Redwood City, CA (US); Chung-Ching Yang, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/789,458

(22) Filed: Feb. 20, 2001

(65) Prior Publication Data

US 2002/0113250 A1 Aug. 22, 2002

(51) Int. Cl.$^7$ ............................................. H01L 27/15
(52) U.S. Cl. ..................... 257/80; 257/7; 257/86; 257/103; 257/214; 257/298; 257/432; 257/436; 257/444; 257/461; 438/95; 438/96; 438/389
(58) Field of Search ............................. 257/7, 95, 96, 257/761–766, 80, 86, 103, 214, 298, 432, 436, 444, 461, 102; 438/95, 96, 389

(56) References Cited

U.S. PATENT DOCUMENTS

| | | | |
|---|---|---|---|
| 4,177,475 A | * 12/1979 | Holmberg | 357/2 |
| 4,653,024 A | * 3/1987 | Young et al. | 365/113 |
| 4,719,594 A | 1/1988 | Young et al. | |
| 4,737,934 A | * 4/1988 | Ross et al. | 365/106 |
| 4,774,702 A | * 9/1988 | Giacomel | 369/100 |
| 4,868,616 A | * 9/1989 | Johnson et al. | 357/17 |
| 5,215,862 A | 6/1993 | Suzuki | |
| 5,596,522 A | * 1/1997 | Ovshinsky et al. | 365/113 |
| 5,714,768 A | 2/1998 | Ovshinsky et al. | |
| 6,141,241 A | 10/2000 | Ovshinsky et al. | |
| 6,221,455 B1 | * 4/2001 | Yasuda et al. | 428/64.1 |

FOREIGN PATENT DOCUMENTS

| | | |
|---|---|---|
| JP | 8104060 A | 10/1994 |
| JP | 06-325406 | 11/1994 |

* cited by examiner

*Primary Examiner*—Hoai Pham
*Assistant Examiner*—Wai-Sing Louie

(57) ABSTRACT

Ultra-high-density data-storage media employing indium chalcogenide, gallium chalcogenide, and indium-gallium chalcogenide films to form bit-storage regions that act as photoconductive, photovoltaic, or photoluminescent semiconductor devices that produce electrical signals when exposed to electromagnetic radiation, or to form bit-storage regions that act as cathodoconductive, cathodovoltaic, or cathodoluminescent semiconductor devices that produce electrical signals when exposed to electron beams. Two values of a bit are represented by two solid phases of the data-storage medium, a crystalline phase and an amorphous phase, with transition between the two phases effected by heating the bit storage region.

20 Claims, 11 Drawing Sheets

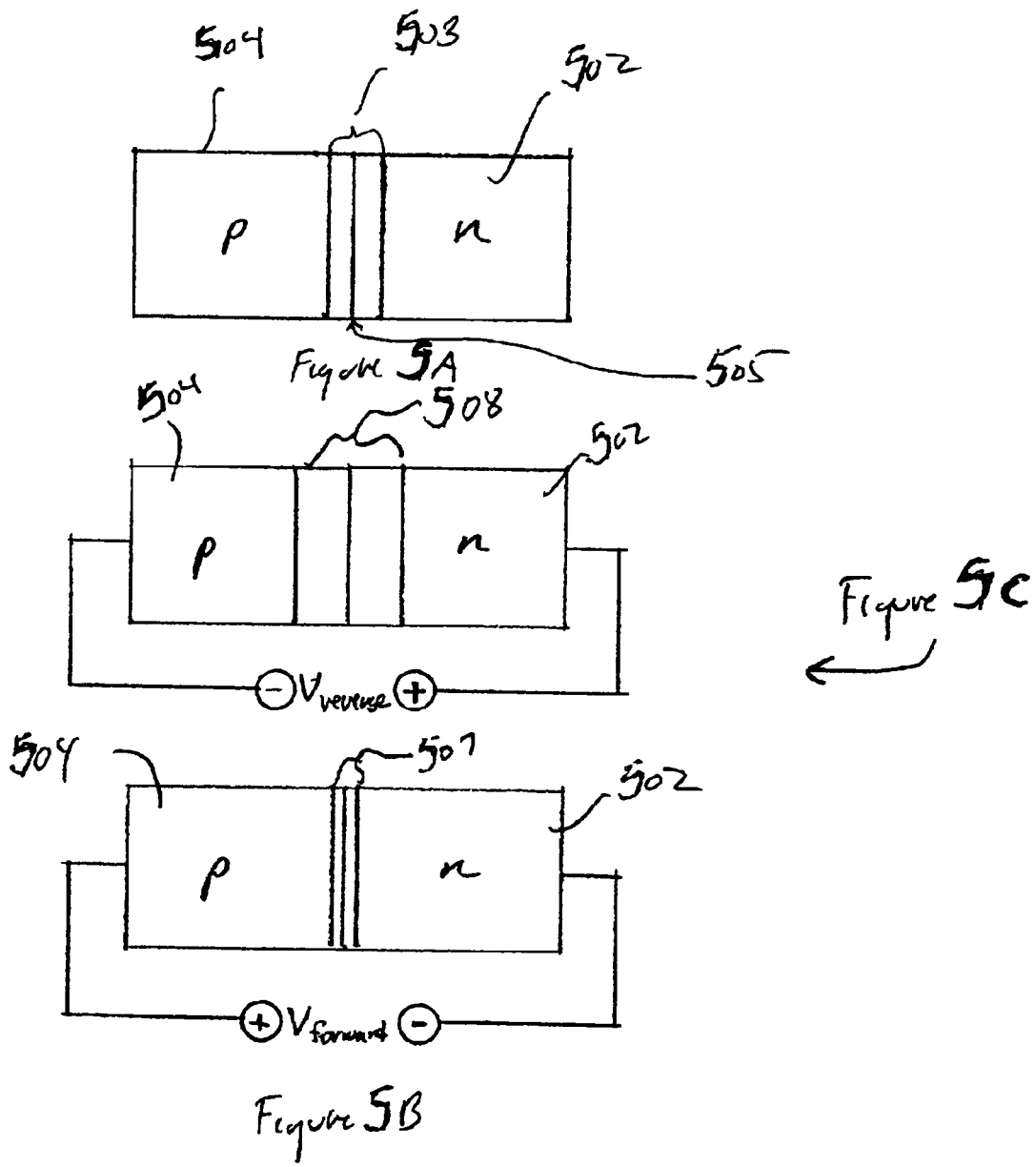

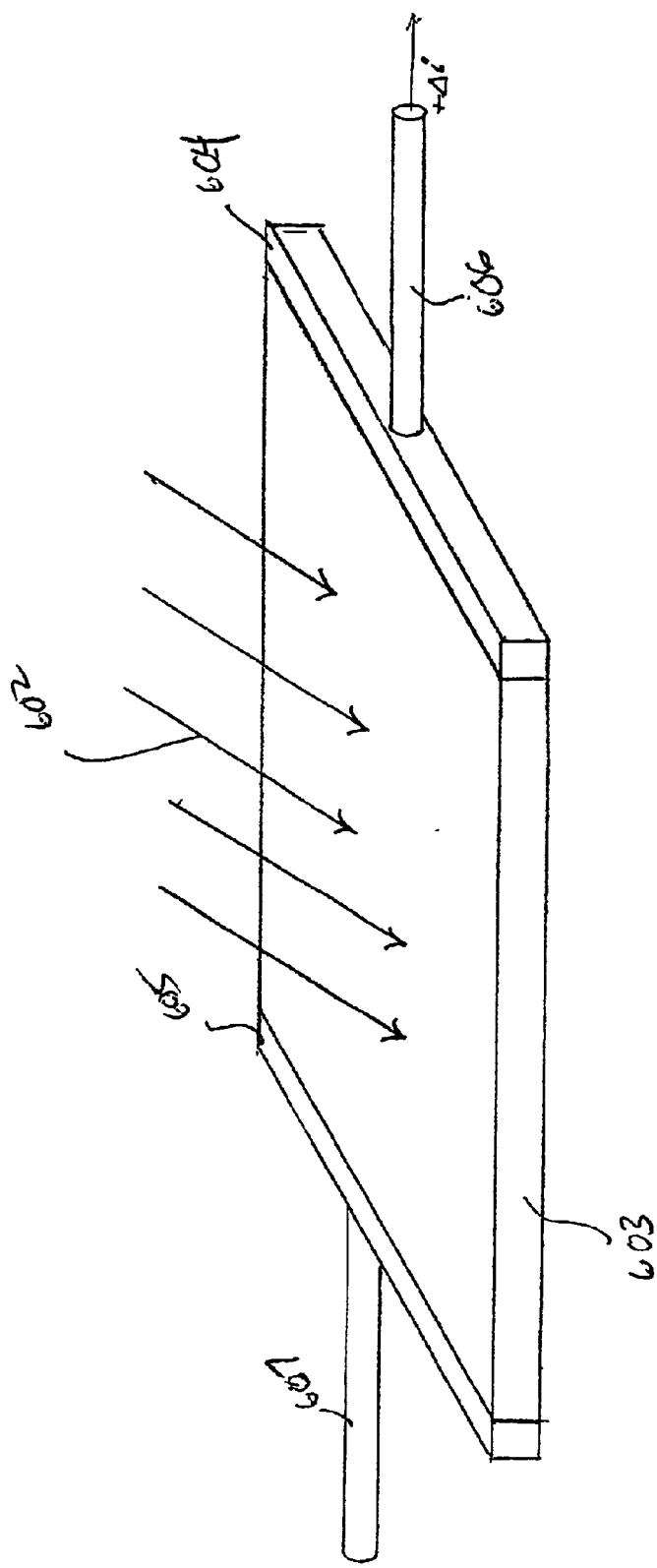

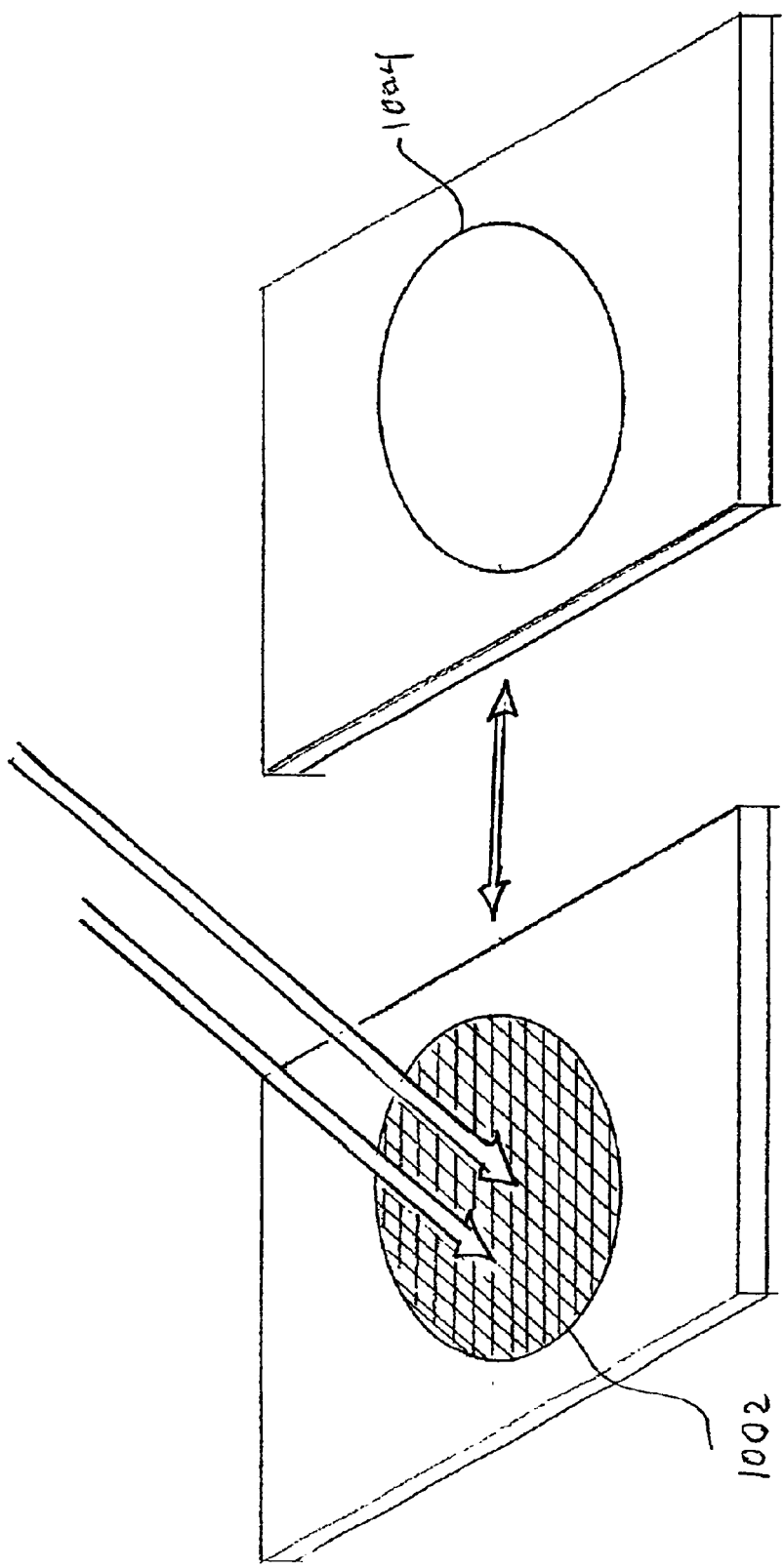

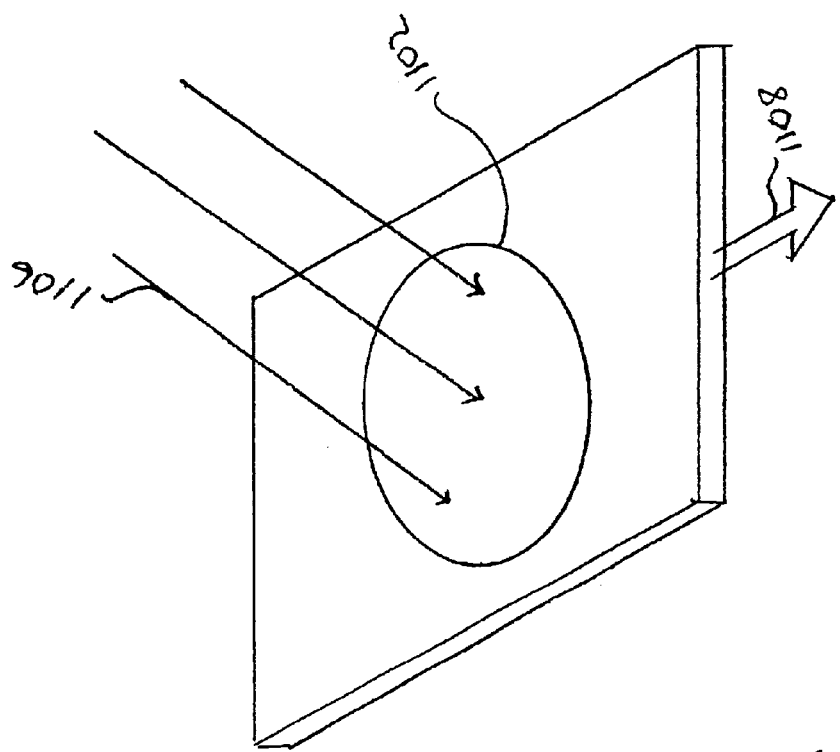
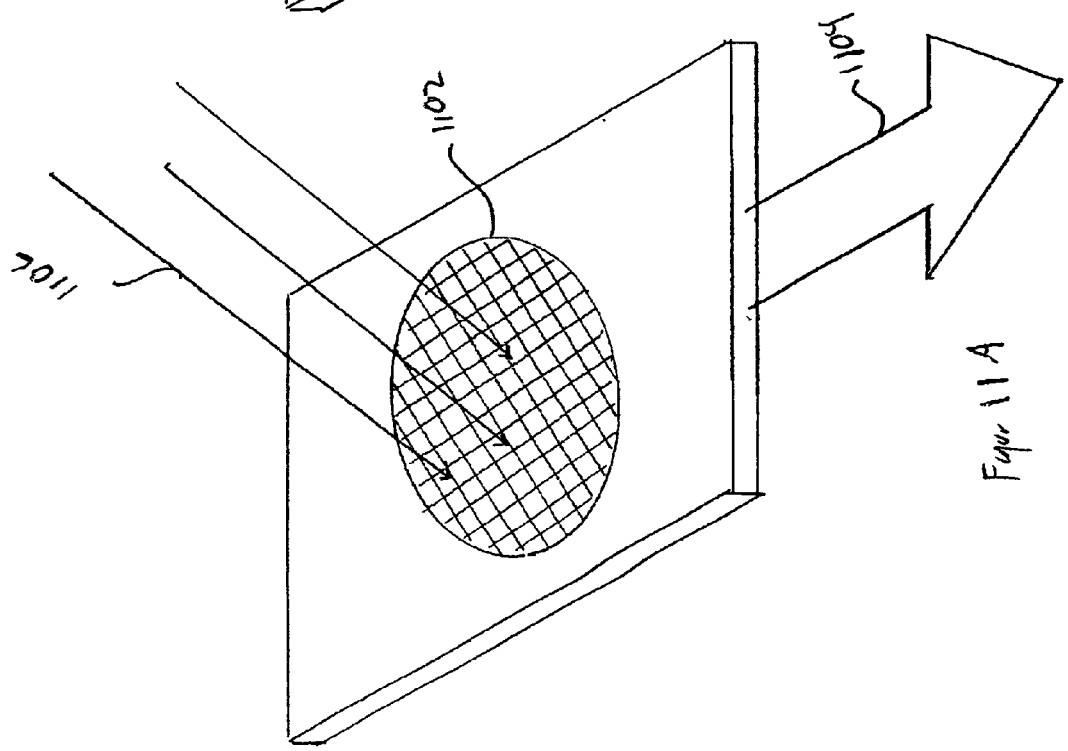

INDIUM CHALCOGENIDE, GALLIUM CHALCOGENIDE, AND INDIUM-GALLIUM CHALCOGENIDE PHASE-CHANGE MEDIA FOR ULTRA-HIGH-DENSITY DATA-STORAGE DEVICES

TECHNICAL FIELD

The present invention relates to ultra-high-density data-storage media for non-volatile electronic data-storage devices, and, in particular, to a class of group 13/III metal/group 16/VI chalcogenide semiconducting compounds with phase change characteristics and electronic properties that allow for bit-storage regions within the data-storage media that can be written multiple times and that act as tiny photoconductive, photovoltaic, photoluminescent, cathodoconductive, cathodovoltaic, or cathodoluminescent semiconductor devices to facilitate data retrieval.

BACKGROUND OF THE INVENTION

FIGS. 1–3 illustrate the energy-level distribution of the quantum states of valence electrons within metals, insulators and semiconductors at 0° K. At 0° K, the energy level of the highest-energy quantum state occupied by an electron is called the Fermi energy, $E_F$. In each of FIGS. 1–3, the numbers of valence electron quantum states at different energy levels are plotted as one or more curves in a graph with a vertical axis corresponding to the number of valence electron quantum states and a horizontal axis corresponding to the relative energy levels of the valence electron quantum states, with $E_F$ plotted along the horizontal axis. Occupied states are shaded below the curve or curves. For example, in FIG. 1, illustrating the energy-level distribution of the quantum states of valence electrons within metals, a single curve 102 represents the number of valence electron quantum states, with respect to the vertical axis 104, for increasing energy levels with respect to the energy level axis 106. The occupied quantum states are represented by shaded region 108, and the unoccupied quantum states occur below the curve and to the right of $E_F$ in an unshaded region 110.

In metals, as illustrated in FIG. 1, $E_F$ falls into the middle 112 of a band of allowed quantum states, closely spaced in energy. Within a band of quantum states, an infinitesimally small voltage allows an electron to be promoted from lower-energy quantum states to higher-energy quantum states, and which therefore allows the electron to move relatively freely through the metal. Metals are good conductors because of these freely moving electrons, which can carry an electrical current.

In insulators, as illustrated in FIG. 2, $E_F$ falls between 202 bands 204 and 206 of quantum states within a band gap 208, in which a comparatively large voltage is required to promote an electron to a more energetic level. As a result, electrons in insulators are comparatively much less mobile, and can carry far less current than metals in response to a given voltage.

Semiconductors are similar to insulators, as illustrated in FIG. 3, except that the bandgap 302 within which $E_F$ falls in a semiconductor, between a lower-energy valence band 304 and a higher-energy conduction band 306, is more narrow than in an insulator, allowing electrons to be promoted by thermal energy from quantum states in the lower-energy valence band with energies below $E_F$ into quantum states in the higher-energy conduction band, with energies above $E_F$. The ability of electrons in semiconductors to be promoted from one quantum state to another provides the electron mobility needed for current flow.

Promotion of an electron produces a negatively charged mobile conduction-band electron, or free electron, as well as positively charged hole in the valence band. Both the mobile electron and the hole are mobile charge carriers that support the flow of current. The density of positive or negative charge carries in a semiconductor can be increased by adding easily-ionized impurities, or dopants, to a semiconductor. A semiconductor material with no added impurities is referred to as an "intrinsic semiconductor." A semiconductor material with added dopants is referred to as an "extrinsic semiconductor." An extrinsic semiconductor with an increased density of positive charge carriers, or holes, is referred to as a "p-type semiconductor," and an extrinsic semiconductor with an increased density of negative charge carriers, or holes, is referred to as an "n-type semiconductor."

Diodes, Diodes, transistors, and other semiconductor devices are based on junctions between two different semiconductor materials of different properties. In heterojunctions, an n-type semiconductor is interfaced to a p-type semiconductor. In homojunctions, two slabs or films of the same bulk semiconductor, with different levels or types of dopants that produce different semiconductor parameters in the two slabs or films, are joined at an interface, and in Schottky diodes, a semiconductor is joined at an interface with a metal. In all such devices, the semiconductor substance on one side of the interface has comparatively greater n-type characteristics than the more p-type substance on the other side of the interface. Principles behind operation of these junction-based devices are illustrated in FIGS. 4A and 4B. In FIG. 4A, the n-type region of a semiconductor device 402 is joined at an interface 403 with a p-type region 404 of the semiconductor device. In the n-type region 402, there are a number of mobile electrons, such as mobile electron 405, and in the p-type region 404, there are a number of holes, such as hole 406.

FIG. 4B illustrates the thermal equilibrium state of a junction-type device. A depletion region 407 forms at the interface 403 by movement of free electrons from the n-type region 402 across the interface 403 into the p-type region 404 where the free electrons combine with electrons holes, effectively collapsing the free electrons and holes into bound valence electrons. Within the depletion region 407, a narrow volume 408 on the n-type-region side of the interface 403 accumulates positive charge as a result of the loss of free electrons to the p-type-region side of the interface, and a narrow, negatively-charged region 409 develops on the p-type-region side of the interface 403 as a result of loss of positively-charge holes to combination with free electrons. The depletion region is associated with an electric field arising from electrostatic forces between the positively charged volume 408 and the negatively charged volume 409. This electric field represents a potential energy barrier for migration of additional free electrons from the n-type region 402 to the p-type region 404. The barrier potential for a silicon-based junction device, for example, is in the range of 0.7 volts.

FIGS. 5A–C illustrate the effects of applying voltage potentials to a semiconductor junction device. A semiconductor junction device is shown in FIG. 5A with an n-type region 502, a depletion region 503, a p-type region 504, and an interface 505 between the n-type and p-type regions. In FIG. 5B, an external voltage potential is applied to the semiconductor junction device, with the negative direction of the potential applied to the n-type region 502 and the positive direction of the potential applied to the p-type region 504. Application of an external voltage in this orientation is referred to as "forward biasing" of the semiconductor junction device, and has the effect of narrowing the depletion region 507 and decreasing the barrier potential associated with the depletion region. FIG. 5C illustrates application of an external voltage in an opposite orientation from that shown in FIG. 5B. In this orientation, the externally applied potential is said to reverse bias the semiconductor-based junction device. Reverse biasing has the effect of broadening, or widening, the depletion region 508 and increasing the potential barrier associated with the depletion region. In a reverse-biased junction device, or reverse-biased diode, a small reverse current arises from a few thermally excited electrons within the p-type region driven by the barrier potential to cross the interface to the n-type region 502. If too great an external reverse biasing voltage is applied to the device, and the electric field within the depletion region 508 grows too strong, the reverse current can precipitously increase and result in damage to the semiconductor junction device.

Semiconductors and semiconductor junction devices exhibit useful properties when exposed to electromagnetic radiation or high-energy electron beams. FIG. 6 illustrates the principle behind a photoconductive or cathodoconductive device. A photoconductive device responds to incident electromagnetic radiation, and a cathodoconductive device responds to an incident electron beam. In FIG. 6, the incident electromagnetic radiation or electron beam is represented by incident arrows, such as incident arrow 602. The photoconductive or cathodoconductive device consists of a slab, or film, of semiconductor material 603 coupled via ohmic contacts 604 and 605 to a conductive wire or element 606 and 607. The incident radiation or electron beam excites electrons within the semiconductor 603, resulting in promotion of additional electrons from a valence band to a conduction band. This increase in current carrier density increases the current that flows through the device under a fixed potential and correspondingly decreases the resistance of the device. Thus, a photoconductive or cathodoconductive device produces a signal current when exposed to incident electromagnetic radiation or incident electrons, respectively.

FIG. 7 illustrates operation of a photovoltaic or cathodovoltaic device. A photovoltaic device produces an electrical signal in response to incident electromagnetic radiation, and a cathodovoltaic device produces an electrical signal in response to an incident electron beam. In FIG. 7, an incident electron beam or electromagnetic radiation is represented by incident arrows, such as incident arrow 702. A photovoltaic or cathodovoltaic device is a p-n junction or Schottky diode device 704 under an externally applied, reverse-biasing voltage 705. When incident radiation or electrons are absorbed into the depletion region 706 of the device, electron-hole pairs within the depletion region are created by the incident radiation or electrons. The electric field within the depletion region drives the minority carriers across the junction, creating a photocurrent or a cathodocurrent in a photovoltaic or cathodovoltaic device, respectively. Thus, a photovoltaic or cathodovoltaic device produces an electrical signal in the form of an increased reverse current 710 in response to incident electromagnetic radiation or electrons, respectively.

FIG. 8 illustrates operation of a photoluminescent or cathodoluminescent device. A cathodoluminescent device responds to an incident electron beam and a photoluminescent device responds to incident electromagnetic radiation. In a cathodoluminescent device, a slab or film of semiconductor material 802 responds to an incident electron beam, indicated in FIG. 8 by incident arrows, such as incident arrow 804, by producing electromagnetic radiation, represented in FIG. 8 by outgoing arrows, such as outgoing arrow 806. The incident electron beam excites electrons within the semiconductor material 802 to jump from the lower-energy valence band to the conduction band. These excited electrons subsequently return to the valence band by recombining with holes. During the recombination process, an electron releases energy in the form of electromagnetic radiation with a wavelength and frequency corresponding to the band gap energy between the valence band and the conduction band. Thus, a cathodoluminescent device produces electromagnetic radiation of characteristic wavelength and frequency when exposed to an incident electron beam.

A number of terms are commonly employed to describe characteristics of semiconductor materials and semiconductor devices. A carrier is either a free electron in a conduction band, or a hole produced in a valence band. In an n-type extrinsic semiconductor, free electrons are the majority carriers and holes produced by thermal excitation and promotion of valence electrons, are minority carriers. Conversely, in a p-type semiconductor, holes are the majority carriers, and free electrons are minority carriers. The lifetime of a carrier, either a free electron or hole, is the time between generation of the carrier and recombination of the carrier with an oppositely charged carrier. Carrier density is the effective concentration of carriers within a solid, for intrinsic semiconductors proportional to the product of the density of states within a conducting band and the probability of occupation of the quantum states within the conducting band. The mobility of carriers is the mean drift velocity of carriers per unit field. The mobility of carriers is a function of temperature and is also characteristic of particular semiconductor materials. Impurities, defects, lattice imperfections, and lattice vibrations all serve to increase the frequency of carrier collisions and to correspondingly decrease the mobility of carriers. A low-leakage photodiode or cathododiode has a relatively low reverse current under a reverse bias voltage in the absence of any illumination or electron-beam stimulation. The generation efficiency of a photovoltaic or cathodovoltaic device refers to the efficiency of transformation of incident radiation or electrons into a detectable electrical signal, and depends on the ability of semiconductor material within the depletion region to absorb incident radiation or electrons as well as the magnitude of the band gap between a valence band and a higher-energy conduction band. The collection efficiency relates the magnitude of a photocurrent or cathodocurrent to the intensity of illumination or electron-beam irradiation. Radiative recombination is the annihilation of a free electron and a hole, resulting emission of a photon. Non-radiative recombination refers to competing processes where no photon is emitted Efforts are currently underway to produce ultra-high-density data-storage devices using semiconductor and layered semiconductor media. FIG. 9 illustrates a small area of the surface of an ultra-high-density storage device medium. The medium is either a thin film of semiconductor material 902 used as a photoconductor or cathodoconductor or a thin semiconductor-based junction surface comprising two thin films of semiconductor material interfaced together to form a photovoltaic or cathodovoltaic device. Regions of the surface of the medium, such as region 904, are designated for each storing a bit of information, and the bit-storing regions are laid out in a regular pattern to allow for automatic access by writing devices and reading devices.

FIG. 10 illustrates the process of writing a bit to a bit-storing region of a semiconductor-based ultra-highdensity data-storage medium. In one scheme, a crystalline-state bit-storing region 1002 is exposed to an incident electron beam of sufficient intensity to melt the orderly crystalline structure of the semiconductor material. When the electron beam is removed, the bit-storing region is quickly cooled to a temperature below the glass transition temperature characteristic to the semiconductor material, and the melted semiconductor material hardens in a glass-like amorphous state 1004. The process can be reversed by re-heating the amorphous-state bit-storing region slightly above the crystallization temperature and allowing the melted semi-conductor material to cool more slowly, favoring re-crystallization. In one scheme, when the bit-storing region 1002 is in a crystalline state, the bit-storing region is considered to store a "1" bit, or to be "on," and when the bit-storing region is in an amorphous state 1004, the bit-storing region is considered to store the bit "0," or to be "off." In a second scheme, the significance of the crystalline versus amorphous states of the bit-storing region is reversed. In other devices, the bit-storing region may exist in more than two differentiable states, in which case more than a single bit can be stored in a single bit-storing region.

Reading of bit-storing regions depends on an ability to detect whether a bit-storing region is in a crystalline state or in an amorphous state. Generally, electrical characteristics of a crystalline semiconductor material are different from those of an amorphous semiconductor material. As one example, the mobility of carriers may be higher in the crystalline state than in the amorphous state. Thus, if the bit-storing device is considered to be part of a photoconductive or cathodoconductive element, then the current that can flow through the bit-storing device under a fixed potential may be higher when the illuminated or electron-beam-interrogated region is in a crystalline state versus the bit-storing region in an amorphous state. A bit-storing region may serve as a tiny photoconductive, cathodoconductive, photovoltaic, cathodovoltaic, photoluminescent, or cathodoluminescent device that produces an electrical signal under incident illumination or electron-beam stimulation. Thus, a suitable semiconductor for a semiconductor-based ultra-high-density data storage is one in which the signal produced by a bit-storing region in a crystalline state is markedly different from the signal produced by a bit-storing region in an amorphous state. The difference between the signals produced by crystalline and amorphous bits is referred to as the "contrast." In a photoconductive or cathodoconductive device, the contrast depends on the generation-efficiency, mobility, and carrier-lifetime differences between the crystalline and amorphous phases. In a photovoltaic or cathodovoltaic device, the contrast depends on the generation efficiency and collection efficiency of the two phases. The performance of all of these devices depends on parameters like the resistivity, which will help determine the quiescent power usage.

FIGS. 11A–B illustrate the principle of data storage in a phase-change medium. In FIG. 11A, the bit-storing region 1102 is in a crystalline state and produces a comparatively large electrical signal 1104 in response to incident radiation 1106. In FIG. 11B, the bit-storing region 1102 is in an amorphous state, and produces a comparatively small 1108 electrical signal in response to incident radiation 1106. In some instantiations, the amorphous region may produce a larger signal than the crystalline one.

Thus, inventors and manufacturers of semiconductor-based, ultra-high-density data-storage devices have recognized the need for identifying semiconductor compounds suitable for media and data-storage devices that: (1) are readily transformed back and forth between crystalline and amorphous states; (2) are chemically stable over many cycles or crystalline-to-amorphous and amorphous-to-crystalline transformations; and (3) exhibit electrical characteristics such that the electrical signal produced from the semiconductor compound in a crystalline state is readily distinguishable from the electrical signal produced by the semiconductor compound in an amorphous state.

SUMMARY OF THE INVENTION

The present invention is directed toward ultra-high-density, phase-change-based data-storage media with bit-storage regions that act as photoconductive, photovoltaic, or photoluminescent semiconductor devices to produce electrical signals when exposed to electromagnetic radiation, or that act as cathodoconductive, cathodovoltaic, or cathodoluminescent semiconductor devices to produce electrical signals when exposed to electron beams. Two values of a bit are represented by two different solid phases of the data-storage medium within a bit-storage region, generally a crystalline phase and an amorphous phase, with transitions between the two phases effected by heating the bit storage region. Suitable semiconductor compounds for these ultra-high-density, phase-change-based data-storage media have the following characteristics: (1) at least two different solid phases that can be readily interconverted; (2) chemical stability over many cycles of phase interconversions; and (3) semiconductor properties that allow the two different solid phases to be distinguished based on the strength or type of a signal elicited by exposure of the data-storage medium to electromagnetic radiation or an electron beam. Embodiments of the present invention include various indium, gallium, and indium-gallium chalcogenide films, including InSe, $In_2Se_3$, InTe, $In_2Te_3$, InSeTe, GaSe, $Ga_2Se_3$, GaTe, $Ga_2Te_3$, GaSeTe, $InGaSe_2$, $InGaTe_2$, and InGaSeTe, which are found to have the desirable characteristics listed above.

BRIEF DESCRIPTION OF THE DRAWINGS

FIGS. 5A–C illustrate the effects of applying voltage potentials to a semiconductor junction device.

FIG. 6 illustrates operation of a photoconductive or cathodoconductive device.

FIG. 10 illustrates the process of writing a bit to a bit-storing region of a semiconductor-based ultra-high-density data-storage medium.

FIGS. 11A–B illustrate the principle of data storage in a phase-change medium.

DETAILED DESCRIPTION OF THE INVENTION

Figure 1:
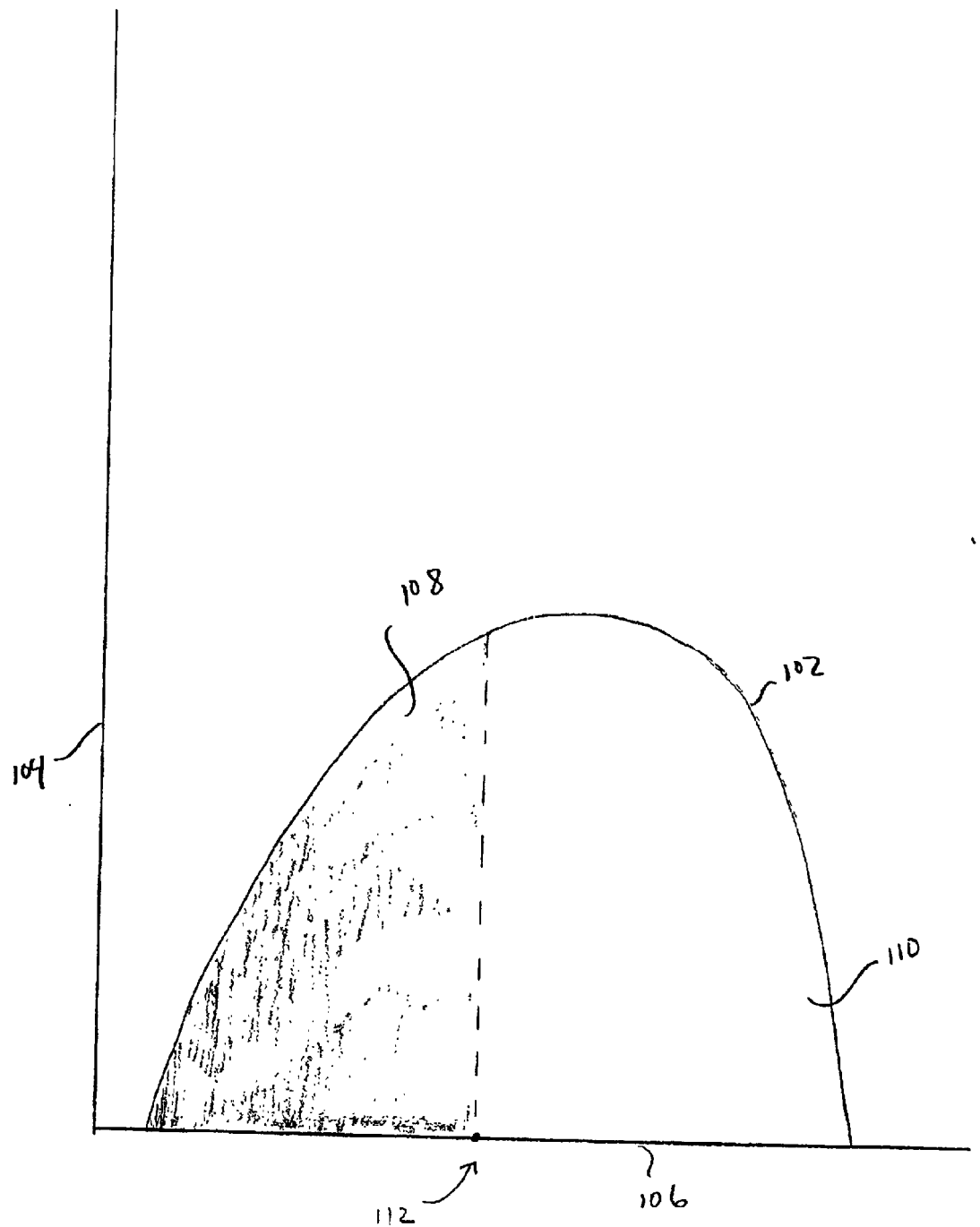
FIGS. 1–3 illustrate the energy-level distribution of the quantum states of valence electrons within metals, insulators and semiconductors at 0° K.
Figure 2:
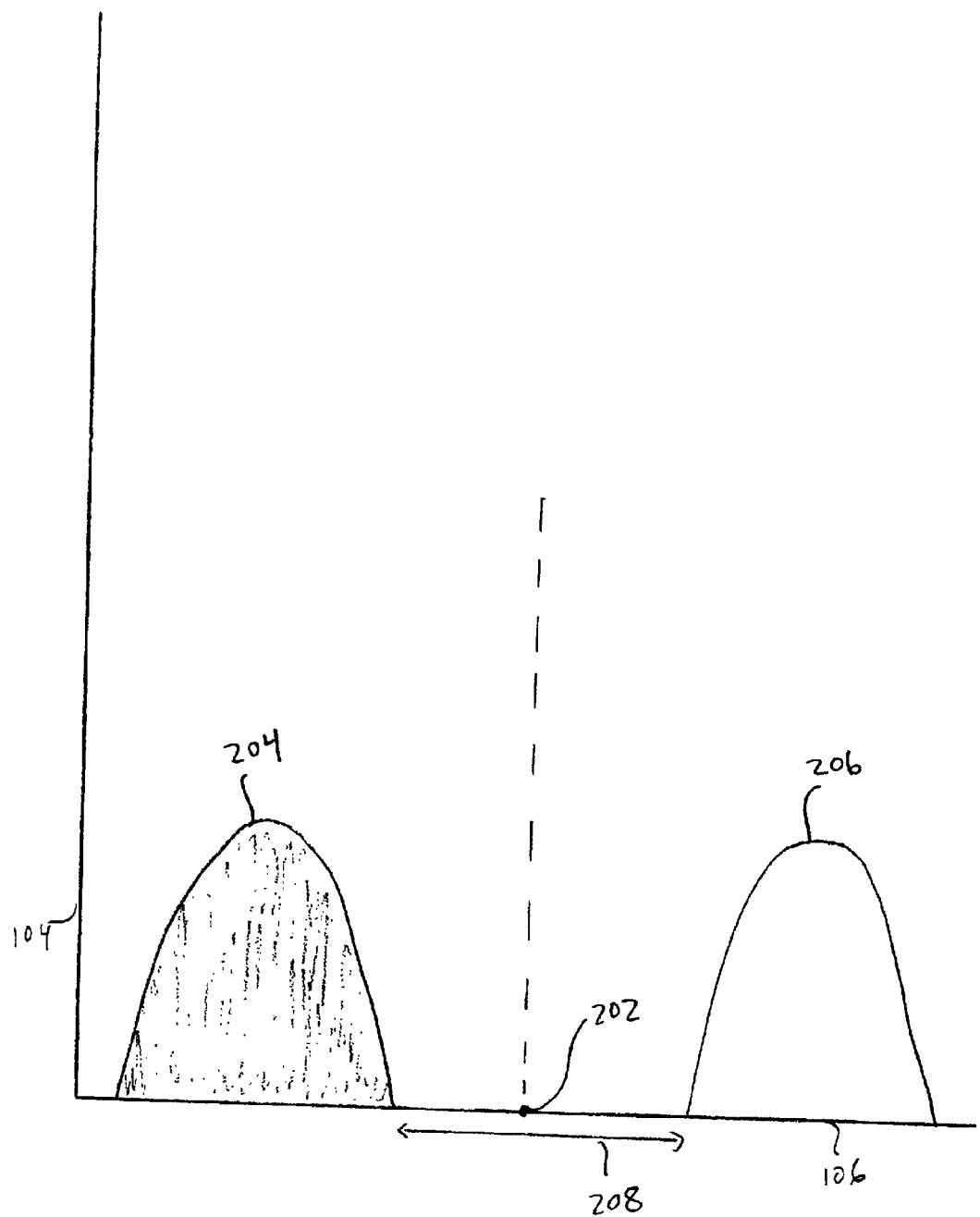
Figure 3:
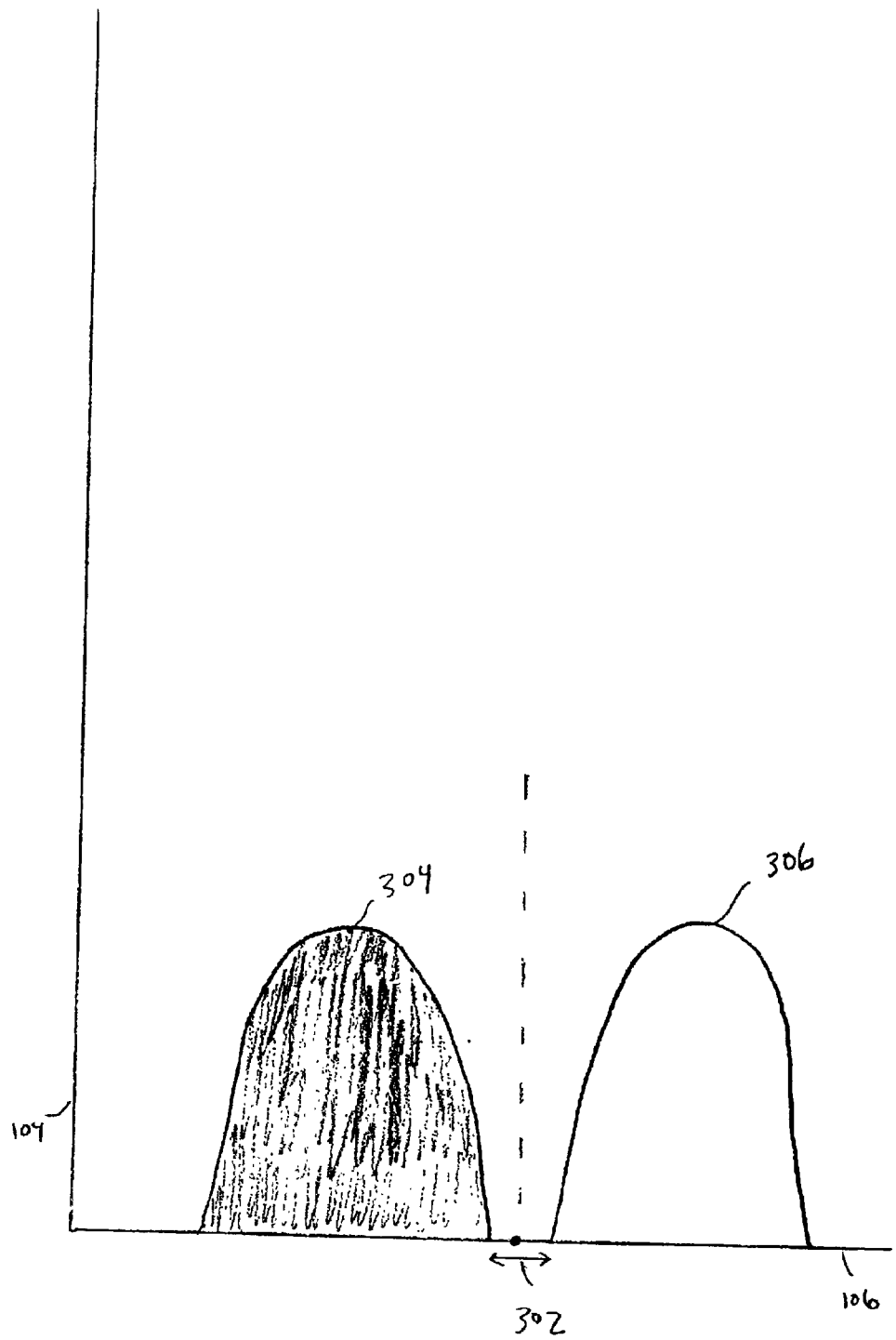
Figure 4A:
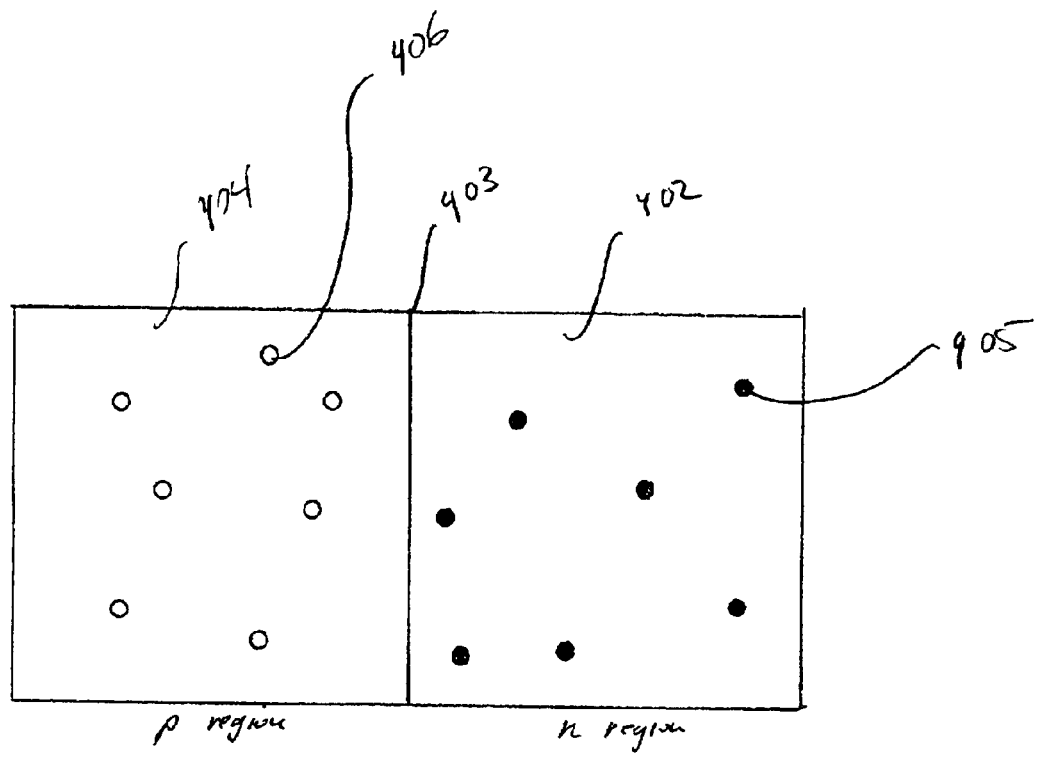
FIGS. 4A–B illustrate characteristics of semiconductor junction devices.
Figure 4B:
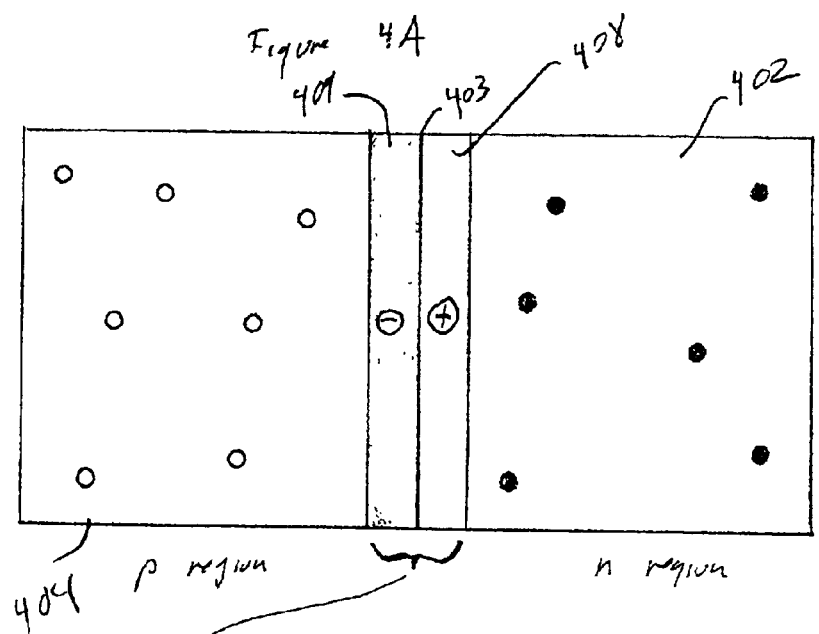
Figure 7:
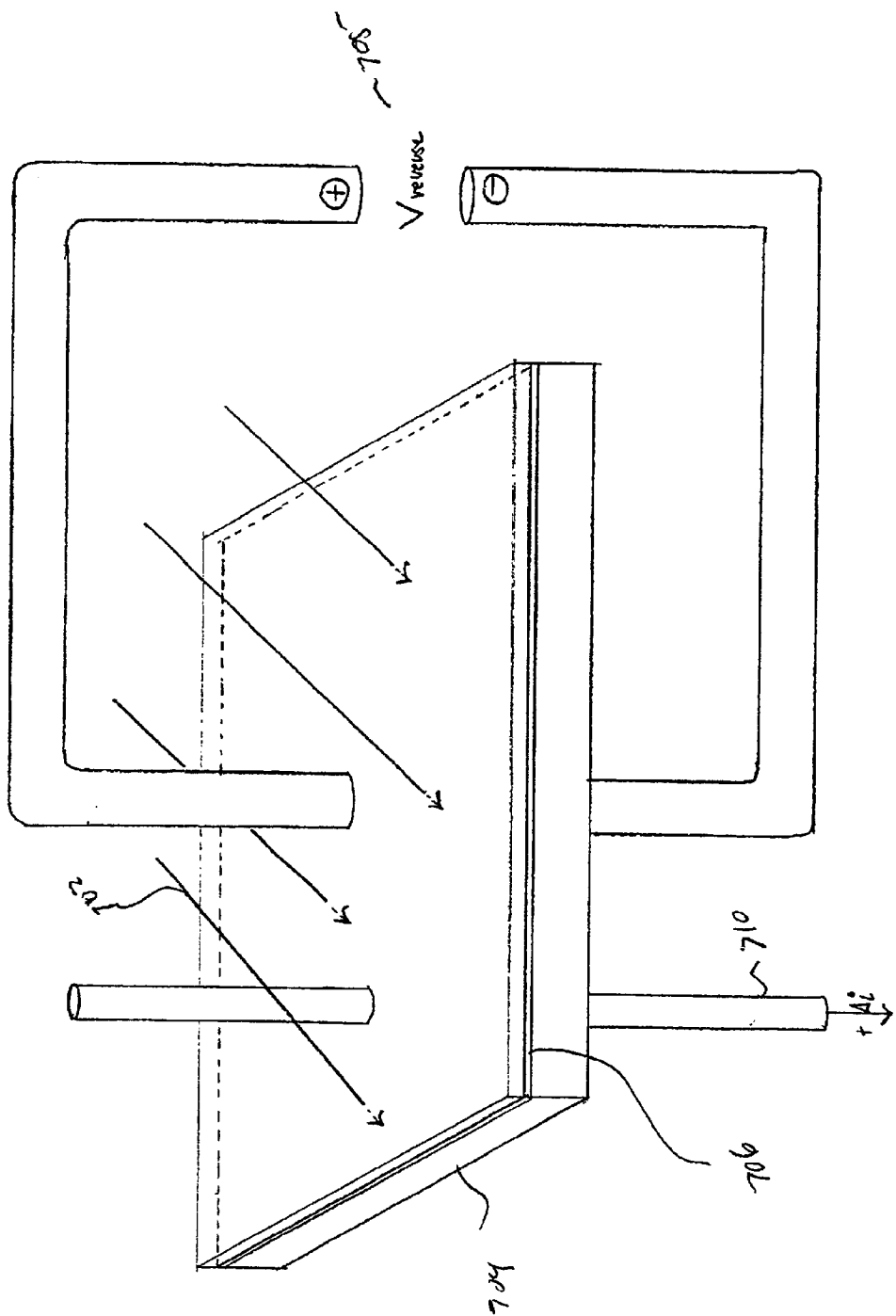
FIG. 7 illustrates operation of a photovoltaic or cathodovoltaic device.
Figure 8:
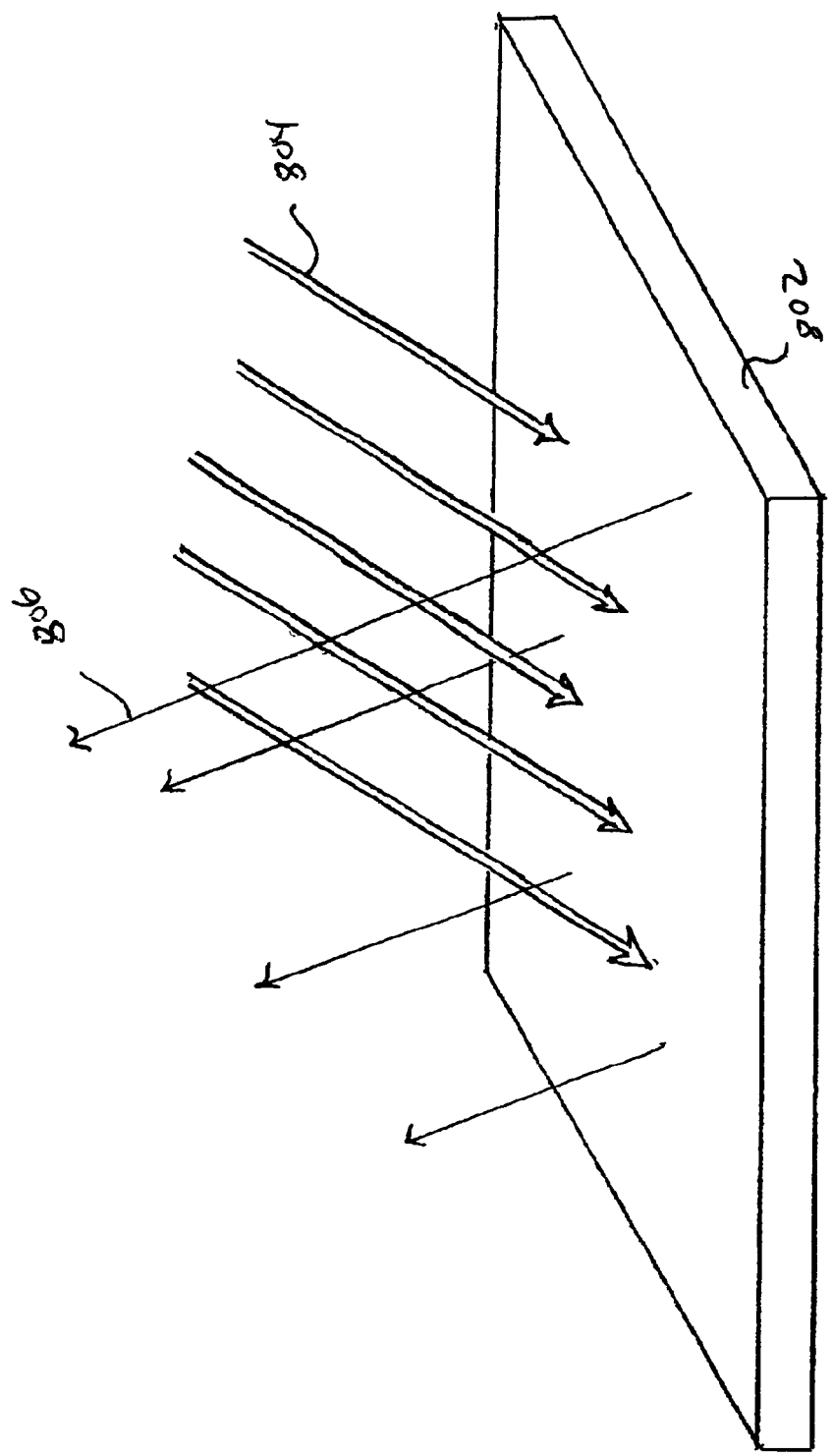
FIG. 8 illustrates operation of a photoluminescent or cathodoluminescent device.
Figure 9:
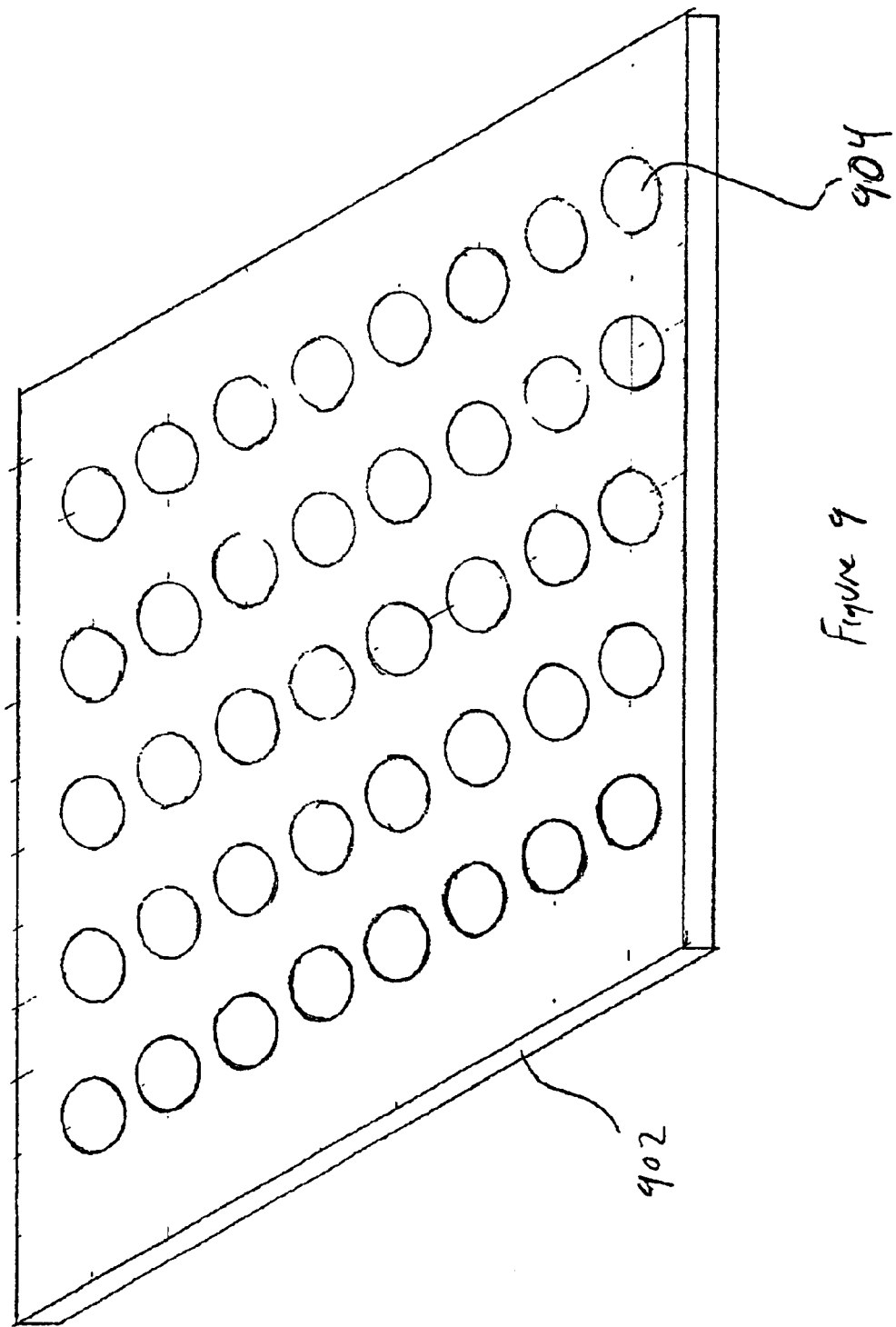
FIG. 9 illustrates a small area of the surface of an ultra-high-density storage device medium.

The present invention is directed towards semiconductor-based, phase-change media for use in ultra-high-density data-storage devices. Currently, GeSbTe and its compounds are widely used in optical recording devices, such as writable compact disks and DVD-RAM, in which data bits are written by changing data-bit-storing regions of a GeSbTe medium from an amorphous state to a crystalline state and from a crystalline state to an amorphous state, and data is read form the GeSbTe medium by detecting the difference in optical reflectivity of amorphous GeSbTe and crystalline GeSbTe.

GeSbTe compounds have been proposed for ultra-high-density data-storage devices as well. In such devices, the bit-storing regions serve as tiny photoconductive, photovoltaic, cathodoconductive, cathodovoltaic, photoluminescent, or cathodoluminescent devices that produce markedly different electrical signals upon exposure to electromagnetic radiation or electron beams, depending on whether or not the GeSbTe is in a crystalline or amorphous state.

Although GeSbTe and related phase-change compounds, such as $InAgTe_2$, have very favorable properties for optical data storage, including low melting temperatures, chemical stability, and a large refractive difference between crystalline and amorphous states, these compounds are found to have poor semiconductor characteristics for use in cathodoconductive, cathodovoltaic, photoconductive, photovoltaic, photoluminescent, and cathodoluminescent devices. As one example, GeSbTe materials have a band gap of only between 0.1 and 0.3 electron volts. This small band gap results in high carrier density and correspondingly high reverse currents in diode-based devices. As another example, the high conductivity of GeSbTe compounds inhibit formation of a depletion region in semiconductor-based junction devices. GeSbTe compounds have poor thermal stability with respect to electrical properties, and generally have high defect densities that result in both low carrier lifetime and low carrier mobilities. The low band gap of GeSbTe compounds produces, upon carrier recombination, electromagnetic radiation of insufficient frequency for convenient detection of cathodoluminescense.

A semiconductor-based, phase-change medium for use in a ultra-high-density data-storage device needs to have the following characteristics: (1) a reasonably low melting temperature and a readily achieved change in solid-state phases between a crystalline state and an amorphous state or between two different and differentiable crystalline states; (2) chemical stability over a great number of phase-change cycles; and (3) semiconductor characteristics such that, when a bit-storing region of the medium is employed in a semiconductor device to produce an electrical signal, the electrical signal produced by the semiconductor compound in a first solid state phase must differ substantially from the electrical signal produced by the semiconductor in a second solid state phase, and, in one of the two phases, the electrical signal must be readily inducible via exposure to electromagnetic radiation or to an electron beam.

Photoconductive and cathodoconductive semiconductor devices require high carrier mobility, high carrier lifetime, and low carrier density. Photovoltaic and cathodovoltaic semiconductor devices require that the semiconductor medium forms a low-leakage diode with good collection efficiency. A photoluminescent or cathodoluminescent semiconductor device requires both a high radiative recombination efficiency and a band gap energy equivalent to the energy of visible or near-infrared electromagnetic radiation. Various embodiments of the present invention relate to identification of polycrystalline indium and gallium chalcogenides as suitable semiconductor media for incorporation into ultra-high-density data-storage devices. These material have reasonably low melting temperatures and are easily interconverted between crystalline and amorphous states, have convenient and controllable carrier density and band gaps, have low defect densities, and have high chemical stability. Moreover, polycrystalline indium and gallium chalcogenides are easily fabricated into semiconductor films for use in ultra-high-density data-storage devices using standard fabrication techniques. An additional advantage of the indium and gallium chalcogenides is that their band gaps are slightly larger than the band gap of silicon, so that photoconductive or photovoltaic light detector devices integrated into a silicon substrate on which films of indium and gallium chalcogenides are deposited can easily detect electromagnetic radiation produced by carrier recombination within the indium and gallium chalcogenide films.

In particular, the following indium-based solid semiconductor compounds are found to have desirable semiconductor properties for use in semiconductor-based, phase-change media of ultra-high-density data-storage devices: (1) InSe; (2) $In_2Se_3$; (3) InTe; (4) $In_2Te_3$; and (5) InSeTe. Solid solutions of these indium-based semiconductor compounds are also found to have desirable semiconductor properties for use in semiconductor-based, phase-change media of ultra-high-density data-storage devices. The following gallium-based solid semiconductor compounds are found to have desirable semiconductor properties for use in semiconductor-based, phase-change media of ultra-high-density data-storage devices: (1) GaSe; (2) $Ga_2Se_3$; (3) GaTe; (4) $Ga_2Te_3$; and (5) GaSeTe. Solid solutions of these gallium-based semiconductor compounds are also found to have desirable semiconductor properties for use in semiconductor-based, phase-change media of ultra-high-density data-storage devices. Additionally, indium gallium chalcogenides, such as $InGaSe_2$ and $InGaTe_2$, and quaternary compounds containing indium, gallium, selenium, and tellurium, such as InGaSeTe are also found to have desirable semiconductor properties for use in semiconductor-based, phase-change media of ultra-high-density data-storage devices. The above-identified indium, gallium, and indium-gallium chalcogenides may be doped with group I,II,IV, or VII elements, and may be alloyed with group II, III, V, or VI elements. The medium may be crystalline, with amorphous written bits, or amorphous, with crystalline written bits, and, in some cases, on and off bits may be represented by two different crystalline phases of the indium, gallium, and indium-gallium chalcogenide media. For storage devices based on producing electrical signals in response to impinging electron beams, electrodes may be made from refractory metals such as Mo,Nb,Ta,Ti,W,Cr, or V. For storage devices based on producing electrical signals in response to illumination with electromagnetic radiation, electrodes may be made of the refractory metals listed above, or of a transparent conductor such as indium tin oxide.

Indium, gallium, and indium-gallium chalcogenide films may be deposited on suitable substrates, such as glass and silicon substrates, using standard deposition techniques, including thermal evaporation, sputtering, liquid-phase epitaxy, and chemical vapor deposition. For a crystalline medium, indium, gallium, and indium-gallium chalcogenide films may be deposited on a hot substrate as a polycrystalline film, or indium, gallium, and indium-gallium chalcogenide films may be deposited on cold or room-temperature substrates as amorphous films and subsequently heated and cooled to produce polycrystalline films. For an amorphous medium, indium, gallium, and indium-gallium chalcogenide films may be deposited on cold or room-temperature substrates as amorphous films. Indium, gallium, and indium-gallium chalcogenide film media may be additionally capped by a protective or dielectric passivation layer, including layers composed of $SiO_2$, $Al_2O_3$, SiN, $ZrO_2$, $Y_2O_3$, and $TiO_2$. Such layers prevent oxidation of the indium, gallium, and indium-gallium chalcogenide films, passivate deleterious electrically active defects in the films, and help maintain the flatness and chemical composition of the films during writing.

Preferred cathodoconductive embodiments include: (1) a polycrystalline, gamma-phase $In_2Se_3$ film deposited on interdigitated finger electrodes on a glass or dielectric-layer-covered silicon substrate to form cathodoconductive bit-storage regions of an ultra-high-density data-storage medium; (2) interdigitated finger electrodes deposited on a polycrystalline, gamma-phase $In_2Se_3$ film above a glass or dielectric-layer-covered silicon substrate to form cathodoconductive bit-storage regions of an ultra-high-density data-storage medium; (3) a polycrystalline, gamma-phase $In_2Se_3$ film with added Te deposited on interdigitated finger electrodes on a glass or dielectric-layer-covered silicon substrate to form cathodoconductive bit-storage regions of an ultra-high-density data-storage medium; and (4) interdigitated finger electrodes deposited on a polycrystalline, gamma-phase $In_2Se_3$ film with added Te above a glass or dielectric-layer-covered silicon substrate to form cathodoconductive bit-storage regions of an ultra-high-density data-storage medium. Preferred cathodovoltaic embodiments include: (1) a heterojunction-based cathodovoltaic medium comprising an alpha-phase film of $In_2Te_3$ or a gamma-phase film of $In_2Se_3$ and a silicon layer; (2) a Schottky-diode-based cathodovoltaic medium comprising a gamma-phase film of $In_2Se_3$ and a molybdenum layer; (3) a homojunction-based cathodovoltaic medium comprising two InSe films with different doping levels or compositions; (4) a homojunction-based cathodovoltaic medium comprising two InTe films with different doping levels or compositions; and (5) a homojunction-based cathodovoltaic medium comprising two InSeTe films with different doping levels or compositions. The cathodovoltaic media may have coplanar contacts on top of the films, or may have a first contact on top of the films and a second contact below the substrate on which the films are deposited.

What is claimed is :

1. A data-storage medium comprising:
   one or more semiconductor films, the one or more semiconductor films constituting an ultra-high density, phase-change-based data-storage medium, each of the one or more semiconductor films comprising a semiconductor compound selected from among
   an indium chalcogenide;
   a gallium chalcogenide; and
   an indium-gallium chalcogenide.
2. The data-storage medium of claim 1 including chalcogen elements selected from among:
   tellurium; and
   selenium.
3. The data-storage medium of claim 1 wherein the indium chalcogenide is further selected from among:
   InSe;
   $In_2Se_3$;
   InTe;
   $In_2Te_3$; and
   InSeTe.
4. The data-storage medium of claim 1 wherein the gallium chalcogenide is further selected from among:
   GaSe;
   $Ga_2Se_3$;
   GaTe,
   $Ga_2Te_3$; and
   GaSeTe.
5. The data-storage medium of claim 1 wherein the indium-gallium chalcogenide is further selected from among:
   $InGaSe_2$;
   $InGaTe_2$; and
   InGaSeTe.
6. The data-storage medium of claim 1 wherein the semiconductor compound is doped with group I, II, IV, or VII elements.
7. The data-storage medium of claim 1 wherein the semiconductor compound is alloyed with group II, III, V. or VI elements.
8. The data-storage medium of claim 1 wherein a data bit is stored in a bit-storage region of the ultra-high-density data-storage medium, and wherein, when the semiconductor compound within the bit-storage region is in a first solid state phase, the bit-storage region contains a bit having a first bit value, and when the bit-storage region is in a second solid state, the bit-storage region contains a bit having a second bit value.
9. The data-storage medium of claim 8 wherein the first solid state phase is an amorphous phase, wherein the second solid state phase is a crystalline phase, wherein the first bit value is "1," and wherein the second bit value is "0."
10. The data-storage medium of claim 8 wherein the first solid state phase is an amorphous phase, wherein the second solid state phase is a crystalline phase, wherein the first bit value is "0," and wherein the second bit value is "1."
11. The data-storage medium of claim 8 wherein the first solid state phase is a first crystalline phase, wherein the second solid state phase is a second crystalline phase, wherein the first bit value is "0," and wherein the second bit value is "1."
12. The data-storage medium of claim 1 wherein a data bit is stored in a data-entity-storage region of the ultra-high-density data-storage medium, wherein the semiconductor compound within the data-entity-storage region may assume a number of different and differentiable solid state phases, and wherein each of the different and differentiable solid state phases is associated with a unique data-entity value.
13. The data-storage medium of claim 1 wherein data storage regions within the medium act as one of:
    a photoconductive device;
    a photovoltaic device;
    a photoluminescent device;
    a cathodoconductive device;
    a cathodovoltaic device; and
    a cathodoluminescent device.
14. The data-storage medium of claim 1 producing electrical signals in response to an impinging electron or photon beam and including electrodes made from refractory metals such as Mo, Nb, Ta, Ti, W, Cr, or V.
15. The data-storage medium of claim 1 producing electrical signals in response to impinging electromagnetic radiation and including electrodes made from refractory metals such as Mo, Nb, Ta, Ti, W, Cr, V, or of a transparent conductor such as indium tin oxide.
16. The data-storage medium of claim 1 wherein a semiconductor film is deposited on a glass substrate using standard deposition techniques, including:

thermal evaporation;

sputtering;

liquid-phase epitaxy; and chemical vapor deposition.

17. The data-storage medium of claim 1 wherein the semiconductor film is deposited on a silicon-based substrate using standard deposition techniques, including:

thermal evaporation;

sputtering;

liquid-phase epitaxy, and chemical vapor deposition.

18. The data-storage medium of claim 1 wherein the semiconductor film is deposited on a hot substrate as a polycrystalline film.

19. The data-storage medium of claim 1 wherein the semiconductor film is deposited on a cold or room-temperature substrate as an amorphous film.

20. The data-storage medium of claim 19 wherein the semiconductor film is deposited on a cold or room-temperature substrate as an amorphous film is subsequently heated and cooled to produce a polycrystalline film.

* * * * *